(12) United States Patent
Park et al.

(10) Patent No.: US 8,318,523 B2
(45) Date of Patent: Nov. 27, 2012

(54) THIN FILM TRANSISTOR, METHOD OF FABRICATING THE SAME AND ORGANIC LIGHT EMITTING DIODE DISPLAY DEVICE HAVING THE SAME

(75) Inventors: Byoung-Keon Park, Suwon-si (KR);
Jin-Wook Seo, Suwon-si (KR);
Tae-Hoon Yang, Suwon-si (KR);
Kil-Won Lee, Suwon-si (KR);
Dong-Hyun Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 594 days.

(21) Appl. No.: 12/405,466

(22) Filed: Mar. 17, 2009

(65) Prior Publication Data

US 2009/0256469 A1 Oct. 15, 2009

(30) Foreign Application Priority Data

Apr. 11, 2008 (KR) ........................ 10-2008-0033818

(51) Int. Cl.
*H01L 29/04* (2006.01)
(52) U.S. Cl. ............ 438/52; 438/54; 438/382; 438/217; 438/213; 438/403
(58) Field of Classification Search .................. 257/52, 257/54, 382, 217, 213, 403
See application file for complete search history.

(56) References Cited

U.S. PATENT DOCUMENTS

| | | | |
|---|---|---|---|
| 3,465,209 A | 9/1969 | Denning et al. | |
| 5,637,515 A | 6/1997 | Takemura | |
| 6,087,206 A | 7/2000 | Hamada | |
| 6,191,449 B1 | 2/2001 | Shino | |
| 6,380,007 B1 | 4/2002 | Koyama | |
| 6,399,460 B1 | 6/2002 | Yamaguchi et al. | |
| 6,495,857 B2 | 12/2002 | Yamazaki | |
| 6,500,704 B1 | 12/2002 | Hirano et al. | |
| 6,506,669 B1 | 1/2003 | Kuramasu et al. | |
| 6,531,815 B1 | 3/2003 | Okuyama et al. | |

(Continued)

FOREIGN PATENT DOCUMENTS

CN 1388591 A 1/2003

(Continued)

OTHER PUBLICATIONS

KR 2000-41547 (Abstract only).

(Continued)

*Primary Examiner* — Jae Lee
(74) *Attorney, Agent, or Firm* — H.C. Park & Associates, PLC

(57) ABSTRACT

A thin film transistor, a method of fabricating the same, and an OLED display device having the same. The thin film transistor includes a substrate, a semiconductor layer disposed on the substrate and having a channel region, source and drain regions, and a body contact region, a gate insulating layer disposed on the semiconductor layer to expose the body contact region, a silicon layer disposed on the gate insulating layer and contacting the body contact region exposed by the gate insulating layer, a gate electrode disposed on the silicon layer, an interlayer insulating layer disposed on the gate electrode, and source and drain electrodes disposed on the interlayer insulating layer and electrically connected with the source and drain regions, wherein the body contact region is formed in an edge region of the semiconductor layer.

20 Claims, 5 Drawing Sheets

U.S. PATENT DOCUMENTS

| | | |
|---|---|---|
| 6,620,661 B2 | 9/2003 | Maekawa et al. |
| 6,746,905 B1 | 6/2004 | Fukuda |
| 6,893,503 B1 | 5/2005 | Ohnuma et al. |
| 7,045,444 B2 | 5/2006 | Yamazaki et al. |
| 7,098,089 B2 | 8/2006 | Paik |
| 7,130,002 B2 | 10/2006 | Seo et al. |
| 7,202,143 B1 | 4/2007 | Naseem et al. |
| 2001/0025992 A1 | 10/2001 | Nakajima et al. |
| 2001/0041397 A1 | 11/2001 | Fukushima et al. |
| 2002/0013114 A1 | 1/2002 | Ohtani |
| 2002/0016029 A1 | 2/2002 | Kawakita et al. |
| 2002/0096681 A1 | 7/2002 | Yamazaki et al. |
| 2002/0182828 A1 | 12/2002 | Asami et al. |
| 2003/0013279 A1 | 1/2003 | Jang et al. |
| 2003/0030108 A1 | 2/2003 | Morosawa |
| 2003/0148561 A1 | 8/2003 | Nakajima |
| 2003/0155572 A1 | 8/2003 | Han et al. |
| 2003/0201442 A1 | 10/2003 | Makita |
| 2004/0046171 A1 | 3/2004 | Lee et al. |
| 2004/0089878 A1 | 5/2004 | Takehashi et al. |
| 2004/0135180 A1 | 7/2004 | Makita |
| 2004/0164300 A1 | 8/2004 | Yamazaki et al. |
| 2004/0206958 A1 | 10/2004 | Yamazaki et al. |
| 2005/0035352 A1 | 2/2005 | Onizuka |
| 2005/0105037 A1 | 5/2005 | Kim et al. |
| 2005/0110022 A1 | 5/2005 | Kim et al. |
| 2005/0133867 A1 | 6/2005 | Ohtani et al. |
| 2005/0140841 A1 | 6/2005 | Yang et al. |
| 2005/0170573 A1 | 8/2005 | Makita et al. |
| 2005/0285111 A1 | 12/2005 | Tsuboi |
| 2006/0033107 A1 | 2/2006 | Lee et al. |
| 2006/0040438 A1 | 2/2006 | Lu et al. |
| 2006/0115948 A1 | 6/2006 | Tokunaga |
| 2006/0263957 A1 | 11/2006 | Wong et al. |
| 2007/0007529 A1 | 1/2007 | Takemura et al. |
| 2007/0181890 A1 | 8/2007 | Yamazaki et al. |
| 2007/0207577 A1 | 9/2007 | Oyu |
| 2007/0228420 A1* | 10/2007 | Takano et al. .................. 257/211 |
| 2008/0001228 A1 | 1/2008 | Shionoiri et al. |
| 2008/0217620 A1 | 9/2008 | Park et al. |
| 2008/0246027 A1 | 10/2008 | Kim |
| 2009/0008642 A1* | 1/2009 | Kim et al. ....................... 257/59 |

FOREIGN PATENT DOCUMENTS

| | | |
|---|---|---|
| CN | 1638147 | 7/2005 |
| EP | 0 225 821 | 6/1987 |
| EP | 0 816 903 A1 | 1/1998 |
| EP | 1 052 700 | 11/2000 |
| EP | 1 508 921 A2 | 2/2005 |
| EP | 1 524 702 A2 | 4/2005 |
| EP | 1 858 068 | 11/2007 |
| EP | 2 003 695 | 12/2008 |
| EP | 2 009 680 | 12/2008 |
| EP | 2003695 | 12/2008 |
| EP | 2 028 687 | 2/2009 |
| EP | 2 107 613 | 10/2009 |
| JP | 62-104173 | 5/1987 |
| JP | 05-047791 | 2/1993 |
| JP | 06-151859 | 5/1994 |
| JP | 07-176753 | 7/1995 |
| JP | 07-326764 | 12/1995 |
| JP | 08-255907 | 10/1996 |
| JP | 10-012882 | 1/1998 |
| JP | 10-223533 | 8/1998 |
| JP | 10-242477 | 9/1998 |
| JP | 11-008393 | 1/1999 |
| JP | 11-111992 | 4/1999 |
| JP | 11-261075 | 9/1999 |
| JP | 2000-036598 | 2/2000 |
| JP | 2000-114527 | 4/2000 |
| JP | 2000-252474 | 9/2000 |
| JP | 2001-077364 | 3/2001 |
| JP | 2001-319878 | 11/2001 |
| JP | 2002-093745 | 3/2002 |
| JP | 2003-007719 | 1/2003 |
| JP | 2003-075870 | 3/2003 |
| JP | 2003-100633 | 4/2003 |
| JP | 2003-188098 | 7/2003 |
| JP | 2003-203924 | 7/2003 |
| JP | 2003-298059 | 10/2003 |
| JP | 2003-303831 | 10/2003 |
| JP | 2003-318194 | 11/2003 |
| JP | 2004-022845 | 1/2004 |
| JP | 2005-123565 | 5/2005 |
| JP | 2005-181973 | 7/2005 |
| JP | 2005-197526 | 7/2005 |
| JP | 2006-49823 | 2/2006 |
| JP | 2006-066860 | 3/2006 |
| JP | 2006-345003 | 12/2006 |
| JP | 2007-251149 | 9/2007 |
| KR | 1999-75412 | 10/1999 |
| KR | 1999-88504 | 12/1999 |
| KR | 2000-52006 | 8/2000 |
| KR | 2003-3043 | 1/2003 |
| KR | 2003-57656 | 7/2003 |
| KR | 2003-69779 | 8/2003 |
| KR | 2003-73075 | 9/2003 |
| KR | 2003-73076 | 9/2003 |
| KR | 2003-84738 | 11/2003 |
| KR | 2004-82168 | 9/2004 |
| KR | 10-482462 | 4/2005 |
| KR | 2005/36625 | 4/2005 |
| KR | 10-2005-0049684 | 5/2005 |
| KR | 10-2005-0049692 | 5/2005 |
| KR | 2005-41836 | 5/2005 |
| KR | 2005-9529 | 8/2005 |
| KR | 2005-106244 | 11/2005 |
| KR | 2006-99694 | 9/2006 |
| KR | 10-2007-0024016 | 3/2007 |
| KR | 2008-0082827 | 9/2008 |

OTHER PUBLICATIONS

U.S. Appl. No. 12/130,340, filed May 30, 2008, Byoung-Keon Park et al., Samsung Mobile Display Co., Ltd.

U.S. Office Action dated Mar. 8, 2010, issued in U.S. Appl. No. 12/194,739.

Final Office Action of U.S. Appl. No. 12/194,730 issued on May 4, 2011.

Final Office Action of U.S. Appl. No. 12/130,340 issued on May 12, 2011.

Japanese Journal of Applied Physics; vol. 28, No. 7, pp. 1272-1273; 1989; XP009121147.

European Office Action issued on Aug. 11, 2009 in corresponding European Patent Application No. 08 157 16.1.

U.S. Appl. No. 12/502,413, filed Jul. 14, 2009, Byoung-Keon Park et al., Samsung Mobile Display Co., Ltd.

Fariborz Assaderaghi et al.: "Dynamic Threshold-Voltage MOSFET (DTMOS) for Ultra-Low Voltage VLSI" IEEE Transactions on Electron Devices, IEEE Service Center, Piscataway, NJ, US, vol. 44, No. 3, Mar. 1, 1997, XP011016082.

Office Action issued Aug. 28, 2009, in corresponding Chinese Patent Application No. 200810214019.

European Search Report issued Sep. 2, 2009 in corresponding European Application No. 09156279).

European Partial Search Report issued Sep. 4, 2009 in corresponding European Patent Application No. 09157829.

US Office Action dated Nov. 26, 2010, issued in corresponding U.S. Appl. No. 12/130,340.

US Office Action dated Dec. 9, 2010, issued in corresponding U.S. Appl. No. 12/194,730.

US Office Action dated Dec. 23, 2010, issued in corresponding U.S. Appl. No. 12/194,739.

European Search Report issued Nov. 3, 2009 in corresponding European Patent Application No. 09165373.3.

Jones, et al., "'Diffusivity of impurities in polysilicon", Feb. 21, 2007, XP009150765.

Non-final Office Action of U.S. Appl. No. 12/409,085 issued on Jun. 24, 2011.

Search Report issued by European Patent Office in European Patent Application No. 08157167.1-2203 on Nov. 28, 2008.

Search Report issued by European Patent Office in European Patent Application No. 08162758.0-1528 on Dec. 11, 2008.

Office Action issued by Korean Intellectual Property Office in Korean Patent Application No. 10-2007-0053314 on Mar. 25, 2008.

Notice of Allowability issued by Korean Intellectual Property Office in Korean Patent Application No. 10-2007-0053314 on Sep. 29, 2008.

Notice of Allowability issued by Korean Intellectual Property Office in Korean Patent Application No. 10-2007-0084412 on Dec. 26, 2008.

Notice of Allowability issued by Korean Intellectual Property Office in Korean Patent Application No. 10-2007-084934 on Dec. 26, 2008.

Hu, Chen-Ming, et al. "Gettering of Nickel within Ni-Metal Induced Lateral Crystallization Polycrystalline Silicon Film through the Contact Holes", *Japanese Journal of Applied Sciences*, V. 46, No. 48. 2007 pp. L1188-L1190.

Ng, K.K. *Complete Guide to Semiconductor Devices*, 2$^{nd}$ Ed., Wiley Publishers (New York), 2002, pp. 694-695.

Myers, S.M., et al. "Mechanisms of Transition-metal Gettering in Silicon", *Journal of Applied Physics*, V. 88, No. 7 (Oct. 1, 2000), pp. 3795-3819.

Benton, J.L., et al. "Behavior of Molybdenum in Silicon Evaluated for Integrated Circuit Processing", *Journal of Electrochemical Society*, V. 146, No. 5, (1999), pp. 1929-1933.

U.S. Appl. No. 12/409,085, filed Mar. 23, 2009, Byoung-Keon Park et al., Samsung Mobile Display Co., Ltd.

U.S. Appl. No. 12/199,232, filed Aug. 27, 2008, Yong-Chan You et al., Samsung SDI Co., Ltd.

U.S. Appl. No. 12/194,739, filed Aug. 20, 2008, Byeong-Keon Park et al., Samsung Mobile Display Co., Lt.d.

U.S. Appl. No. 12/194,730, filed Aug. 20, 2008, Byoung-Keon Park et al., Samsung Mobile Display Co., Ltd.

Final Office Action of U.S. Appl. No. 12/194,739 issued on Jun. 9, 2011.

Notice of Allowance issued for related U.S. Appl. No. 12/194,730 dated Jun. 12, 2012.

Final Office Action of U.S. Appl. No. 12/130,340 dated Mar. 8, 2012.

Final Office Action of U.S. Appl. No. 12/194,739 dated Jul. 6, 2012.

Final Office Action of U.S. Appl. No. 12/502,413, dated Feb. 16, 2012.

Non-Final Office Action issued on Sep. 30, 2011 in co-pending U.S. Appl. No. 12/502,413.

Non-Final Office Action issued on Oct. 7, 2011 in co-pending U.S. Appl. No. 12/130,340.

Non-Final Office Action issued on Oct. 4, 2011 in co-pending U.S. Appl. No. 12/194,730.

Non-Final Office Action issued on Oct. 17, 2011 in co-pending U.S. Appl. No. 12/409,085.

Non-Final Office Action of U.S. Appl. No. 12/194,739 dated on Jan. 20, 2012.

\* cited by examiner

THIN FILM TRANSISTOR, METHOD OF FABRICATING THE SAME AND ORGANIC LIGHT EMITTING DIODE DISPLAY DEVICE HAVING THE SAME

CROSS-REFERENCE TO RELATED APPLICATION

This application claims the benefit of Korean Patent Application No. 2008-33818, filed Apr. 11, 2008 in the Korean Intellectual Property Office, the disclosure of which is hereby incorporated herein by reference in its entirety.

BACKGROUND OF THE INVENTION

1. Field of the Invention

Aspects of the present invention relate to a thin film transistor, a method of fabricating the same and an organic light emitting diode (OLED) display device having the same.

2. Description of the Related Art

Generally, polycrystalline silicon layers are widely used as semiconductor layers for a thin film transistor because they have fast field effect mobility, and can be applied to a high-speed operation circuit and a complementary metal-oxide-semiconductor (CMOS) circuit. Thin film transistors using the polycrystalline silicon layer are used as a switching device of an active matrix liquid crystal display (AMLCD) device, and switching and driving devices of an active matrix organic light emitting diode (AMOLED) display device.

The polycrystalline silicon (poly-Si) thin film transistors used in active matrix flat panel display devices, such as the AMLCD device or the AMOLED display device, are generally floating body poly-Si thin film transistors (TFT) in which a semiconductor layer is floated in the shape of an island. As the floating body poly-Si TFT gets smaller, a saturation region of a drain current is reduced, and the drain current is also reduced.

In general, the semiconductor layer is formed of a polycrystalline silicon layer over the entire surface of the substrate, and a photoresist pattern is formed on the polycrystalline silicon layer. After that, the polycrystalline silicon layer is etched using the photoresist pattern as a mask, and the edge region of the semiconductor layer is damaged due to an etch solution or plasma used in the etching process. Further, the characteristics of the semiconductor layer become non-uniform or are degraded due to the remaining photoresist in the edge region. For this reason, the TFT having the semiconductor layer changes in characteristics, such as a threshold voltage or s-factor, and has a hump in an I-V curve, which shows the characteristics of the TFT. Such problems are caused by the damaged edge region used as the channel region.

To solve these problems, a gate-body contact TFT in which a semiconductor layer is connected with a gate electrode has been suggested. In the gate-body contact TFT structure, a subthreshold slope value at a low gate voltage is improved, and a high drain current can be obtained at the low gate voltage. Thus, an on/off characteristic can be ensured at the low gate voltage, and a flat panel display device can be driven with low power consumption.

Conventionally, to realize a gate-body contact thin film transistor, a separately extended body contact region for making a contact with a gate electrode is formed in a conventional semiconductor layer. However, the separately extended body contact region increases the area of the semiconductor layer, which is undesirable.

SUMMARY OF THE INVENTION

Aspects of the present invention provide a gate-body contact TFT taking a smaller area in a device than a conventional gate-body contact TFT structure by realizing a gate-body contact structure without a separately extended body contact region in a conventional semiconductor layer region which does not have a body contact region using an edge region of the semiconductor layer as a body contact region, a method of fabricating the gate-body contact TFT, and an OLED display device having the same.

According to aspects of the present invention, a TFT including a substrate; a semiconductor layer disposed on the substrate and having a channel region, source and drain regions and a body contact region; a gate insulating layer disposed on the semiconductor layer and exposing the body contact region; a silicon layer disposed on the gate insulating layer and in contact with the body contact region exposed by the gate insulating layer; a gate electrode disposed on the silicon layer; an interlayer insulating layer disposed on the gate electrode; and source and drain electrodes disposed on the interlayer insulating layer and electrically connected with the source and drain regions, wherein the body contact region is formed in an edge region of the semiconductor layer, a method of fabricating the same, and an OLED display device having the same are provided.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 1A to 4B are plan and cross-sectional views illustrating a method of fabricating a TFT according to an exemplary embodiment of the present invention, wherein the FIGS. 1A, 2A, 3A and 4A are plan views, and FIGS. 1B, 2B, 3B and 4B are cross-sectional views.

DETAILED DESCRIPTION OF THE EMBODIMENTS

Figure 1A:
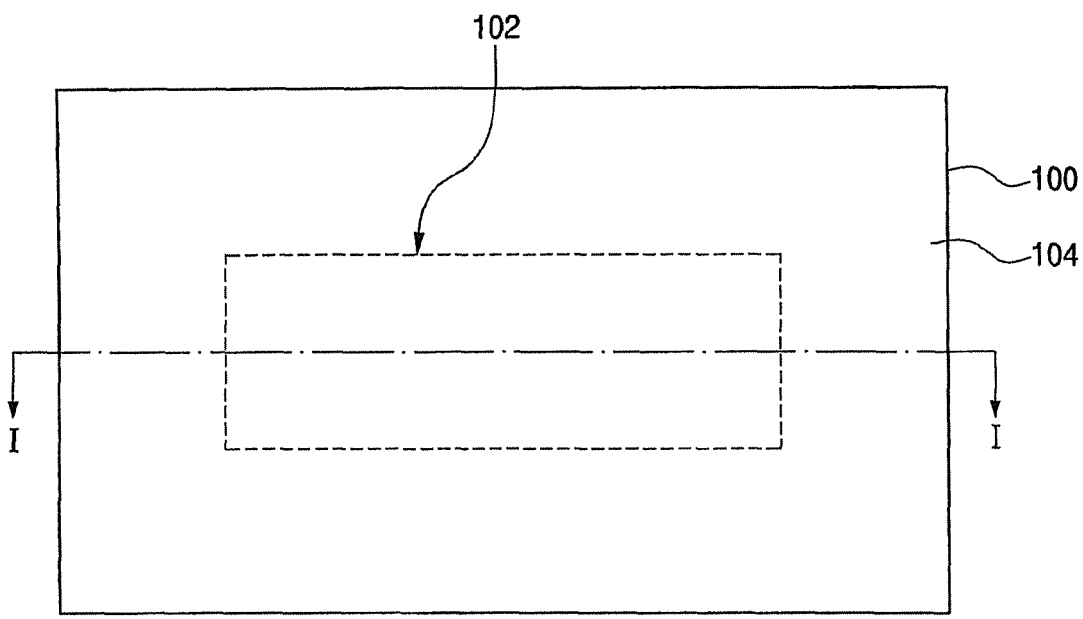

Reference will now be made in detail to aspects of the present invention, examples of which are illustrated in the accompanying drawings, wherein like reference numerals refer to the like elements throughout. The embodiments are described below in order to explain aspects of the present invention with reference to the figures.

Figure 1B:
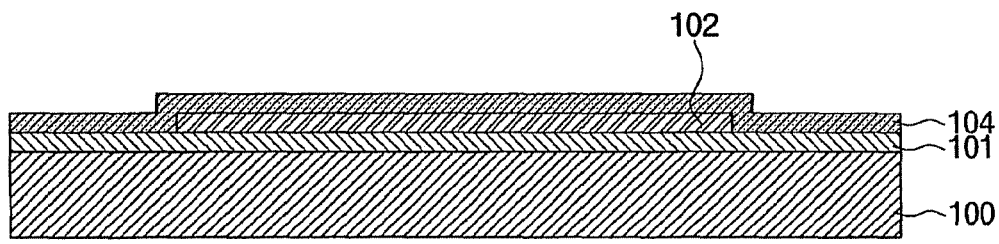

FIG. 1A is a plan view illustrating a method of fabricating a TFT according to an exemplary embodiment of the present invention, and FIG. 1B is a cross-sectional view taken along line I-I of FIG. 1A. Referring to FIGS. 1A and 1B, a substrate 100 is provided. The substrate 100 is formed of glass or plastic. Here, a buffer layer 101 is formed on the substrate 100. The buffer layer 101 serves to prevent diffusion of moisture or impurities generated from the substrate 100, or facilitate crystallization into a polycrystalline silicon layer to be formed in a following process by controlling a heat transfer rate during crystallization. The buffer layer 101 may be a single layer or comprised of multiple layers.

Subsequently, an amorphous silicon layer (not illustrated) is formed on the buffer layer 101. Here, the amorphous silicon layer may be formed by chemical vapor deposition (CVD) or physical vapor deposition (PVD). Moreover, during the deposition, the amorphous silicon layer may be dehydrogenized to reduce a concentration of hydrogen therein.

After that, the amorphous silicon layer is crystallized into a polycrystalline silicon layer and patterned, thereby forming a semiconductor layer 102. According to aspects of the present invention, a crystallization method using a metal catalyst is used to crystallize the amorphous silicon layer into the polycrystalline silicon layer. Such methods to crystallize the amorphous silicon layer into the polycrystalline silicon layer may include metal induced crystallization (MIC), metal induced lateral crystallization (MILC), or super grained silicon (SGS). A phosphorus (P)-injected silicon layer may be formed to remove a remaining metal catalyst from a portion of the semiconductor layer 102 that corresponds to an area in which a channel region is to be formed.

MIC is a method that induces phase-change in an amorphous silicon layer into a polycrystalline silicon layer by contacting a metal catalyst, such as nickel, palladium, or aluminum, or by injecting the metal catalyst into the amorphous silicon layer. MILC is a method that induces sequential crystallization of an amorphous silicon layer into a polycrystalline silicon layer by lateral diffusion of silicide generated in a reaction of a metal catalyst and silicon.

Further, SGS is a method for crystallizing an amorphous silicon layer into a polycrystalline silicon layer having larger-sized grains by forming a capping layer of silicon oxide, silicon nitride, or combinations thereof, to control diffusion or penetration of a metal catalyst into the amorphous silicon layer. A metal catalyst layer is formed on the capping layer and annealed. Upon annealing, the metal catalysts pass through the capping layer and diffuse onto a surface of the amorphous silicon layer to induce the crystallization of the amorphous silicon layer into the polycrystalline silicon layer. That is, the metal catalysts in the metal catalyst layer bind with silicon of the amorphous silicon layer, thereby forming metal silicide, which serves as a seed, i.e., a nucleus of crystallization, to induce the crystallization of the amorphous silicon layer.

Accordingly, an amount of the metal silicide is controlled to control a grain size of the resultant polycrystalline silicon layer. Moreover, since the grain size is dependant on the metal catalyst layer contributing to the crystallization, the grain size of the polycrystalline silicon layer may be controlled by controlling a diffusion blocking ability of the capping layer. The metal catalyst may be one selected from the group consisting of Ni, Pd, Ti, Ag, Au, Al, Sn, Sb, Cu, Co, Mo, Tc, Ru, Rh, Cd and Pt, and may preferably be Ni. A concentration of the metal catalyst in the polycrystalline layer is about $5 \times 10^{12}$ atoms/cm$^2$. The annealing process is performed at a temperature ranging from 400 to 1300° C., and may be performed by at least one of a furnace process, a rapid thermal annealing (RTA) process, an UV process, and a laser process.

Subsequently, a semiconductor layer 102 is formed by patterning the polycrystalline silicon layer. Here, since the semiconductor layer 102 is formed of a polycrystalline silicon layer by a crystallization method using a metal catalyst, the metal catalyst remains in the semiconductor layer 102. The semiconductor layer 102 includes source and drain regions, a channel region, and a body contact region corresponding to an edge region of the semiconductor layer 102. The semiconductor layer 102 may include one or multiple body contact regions 102b at the edge of the semiconductor layer 102, and as shown in FIG. 2A, the body contact regions 102b may be disposed at opposite edge regions 102e of the semiconductor layer 102.

A gate insulating layer 104 is formed on the substrate 100 and the gate insulating layer 104 is formed to cover the semiconductor layer 102. The gate insulating layer 104 may be formed of silicon oxide, silicon nitride, or combinations thereof.

Figure 2A:
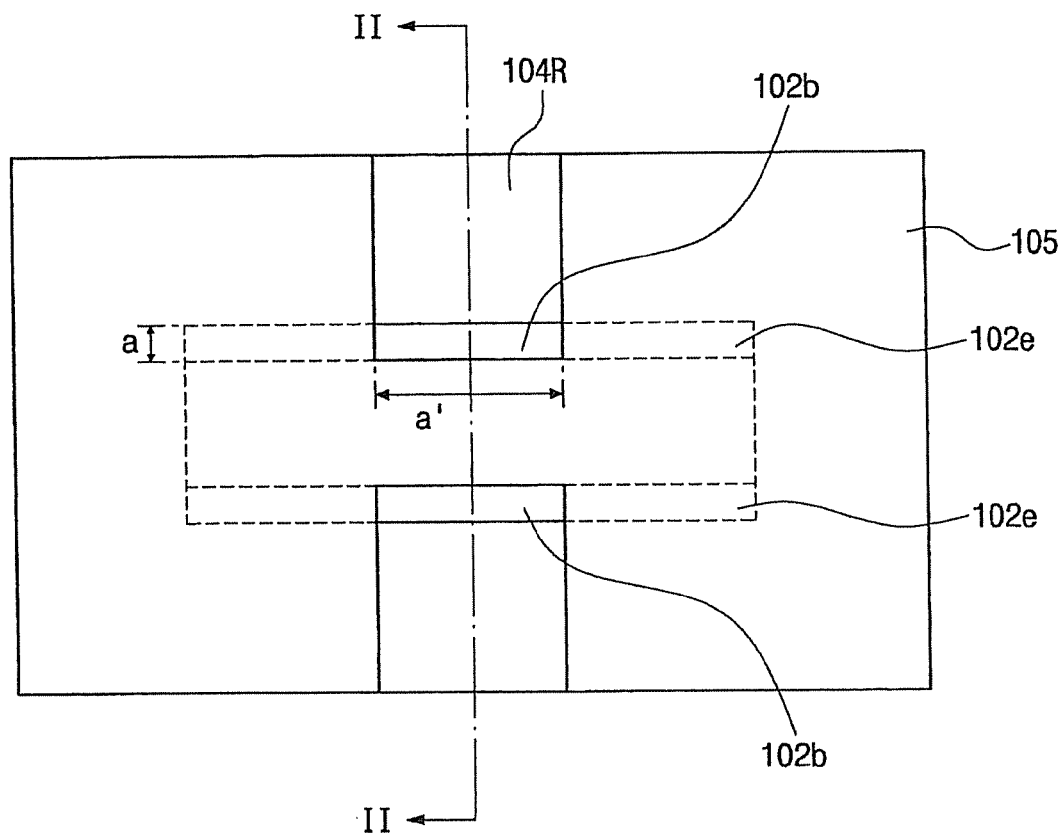
Figure 2B:
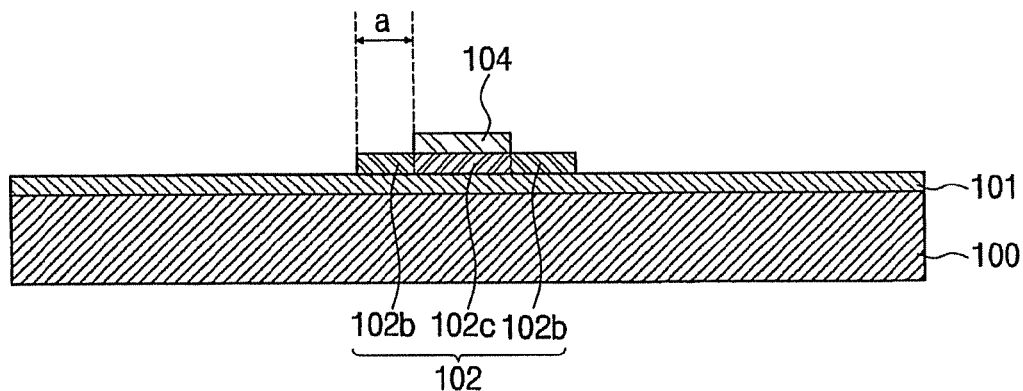

FIG. 2A is a plan view illustrating a method of fabricating a TFT according to an exemplary embodiment of the present invention, and FIG. 2B is a cross-sectional view taken along line II-II of FIG. 2A. Referring to FIGS. 2A and 2B, a photoresist (not shown) is formed on the substrate 100 on which the gate insulating layer 104 and the semiconductor layer 102 are formed, and then the photoresist is exposed to form a photoresist pattern 105. Portions of the photoresist pattern 105 are removed to expose a portion of the gate insulating layer 104 that is to be removed, i.e., the exposed part 104R. The exposed part 104R covers a portion of the edge region 102e of the semiconductor layer 102. The exposed part 104R of the gate insulating layer 104 is removed by etching to expose a portion of the edge region 102e of the semiconductor layer 102, i.e., the body contact regions 102b. Then, the photoresist pattern 105 is removed, thereby forming a structure having an exposed body contact region 102b of the semiconductor layer 102.

Here, the body contact region 102b of the edge region 102e of the semiconductor layer 102 to be exposed is a region spaced apart by a predetermined distance "a" in a width direction from an edge of the semiconductor layer 102. The portion to be exposed to form the body contact region 102b may be singular or plural, may extend inward from opposing edges of the semiconductor layer 102c, and may extend inward in a width direction from opposing edges of the semiconductor layer 102c. In FIG. 2A, the width direction is parallel to the line II-II while the length direction is perpendicular to the line II-II.

The predetermined width a of the edge region 102e may be more than 0 and not more than 0.1 μm. In this range of the width, a gate-body contact TFT structure may be formed without reducing an area of the channel region of the conventional semiconductor layer and separately forming an extended body contact region. Further, the body contact region 102b in the edge region 102e will have a predetermined length a' and be adjacent to the channel region 102c. Thus, in FIG. 2A, the body contact regions 102b have areas of a*a'.

Figure 3A:
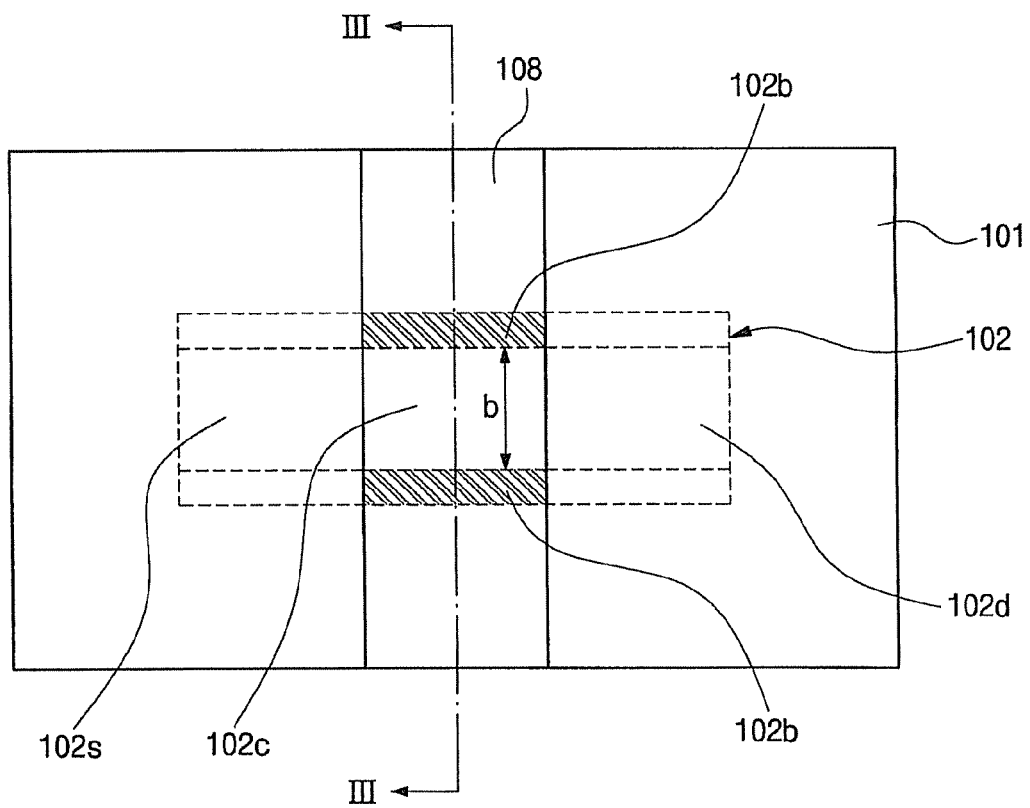
Figure 3B:
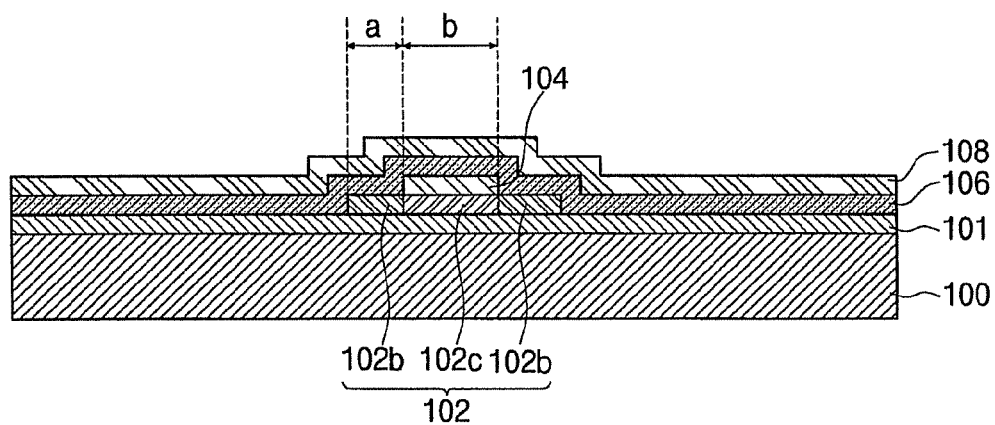

FIG. 3A is a plan view illustrating a method of fabricating a TFT according to the exemplary embodiment of the present invention, and FIG. 3B is a cross-sectional view taken along line III-III of FIG. 3A. Referring to FIGS. 3A and 3B, a silicon layer 106 is formed on the exposed body contact region 102b and in direct contact with the body contact region 102b. The silicon layer 106 is also formed to cover the channel region 102c, on which the gate insulating layer 104 is formed, of the semiconductor layer 102. Here, the silicon layer 106 is formed to a thickness of 100 Å or more to prevent a direct connection between a gate metal of the gate electrode to be formed and the semiconductor layer 102, and formed to a thickness of 500 Å or less in consideration of gate interconnection resistance and etch characteristics.

After that, the silicon layer 106 is doped with an impurity. The impurity injected into the silicon layer 106 has an opposite conductivity to those injected into the source and drain regions 102s and 102d in the semiconductor layer 102, i.e., the impurity injected into the silicon layer 106 has the same conductivity as the channel region 102c of the semiconductor layer 102. Accordingly, the silicon layer 106 is in direct contact with the body contact region 102b, which is formed in a PNP or NPN type together with the source and drain regions 102s and 102d. Thus, the silicon layer 106 prevents the flow of a current through the body contact region 102b from the source and drain regions 102s and 102d. The impurity may be a p- or n-type. The p-type impurity may be one selected from the group consisting of boron (B), aluminum (Al), gallium (Ga), and indium (In), and the n-type impurity may be one selected from the group consisting of phosphorous (P), antimony (Sb), and arsenic (As).

Then, a gate electrode 108 is formed on the silicon layer 106. The gate electrode 108 is formed in a predetermined part corresponding to the semiconductor layer 102 by forming a metal layer (not illustrated) for a gate electrode, for example, a single layer formed of Al or an Al—Nd alloy on the silicon layer 106, or a multilayer formed of an aluminum alloy on a chromium (Cr) or molybdenum (Mo) alloy, and etching the metal layer for a gate electrode using photolithography to form the gate electrode 108. Here, the gate electrode 108 is formed at a region corresponding to the channel region 102c, including the body contact region 102b, of the semiconductor layer 102, thereby defining the channel region 102c and the source and drain regions 102s and 102d in the semiconductor layer 102.

Specifically, the source and drain regions 102s and 102d are formed by injecting an impurity having an opposite conductivity type to that injected into the silicon layer 106 into regions to be the source and drain regions 102s and 102d of the semiconductor layer 102 using the gate electrode 108 as a mask. Additionally, the source and drain regions 102s and 102d may be formed by forming a photoresist pattern exposing the regions to be the source and drain regions and then injecting an impurity thereinto.

Thus, the gate-body contact TFT is realized by making a contact between the gate electrode 108 and the body contact region 102b via the silicon layer 106 doped with the impurity. According to aspects of the present invention, the gate insulating layer 104 is formed on the channel region 102c to expose the body contact region 102b of the edge region 102e of the semiconductor layer 102, and thus the body contact region 102b of the semiconductor layer 102 is in contact with the doped silicon layer 106. Consequently, a width "b" of the gate insulating layer 104 formed in the region corresponding to the channel region 102c is smaller than the sum of the widths of the channel region 102c and the body contact region 102b. Similar to as described above, a length direction with respect to the semiconductor layer 102 is a direction parallel to a line connecting a source region 102s with a drain region 102d of the semiconductor layer 102, and the width direction with respect to the semiconductor layer 102 is a direction perpendicular to a line connecting the source region 102s with the drain region 102d. Herein, a length is a distance parallel to a line between the source and drain regions in the semiconductor layer, and a width is a distance perpendicular to a line between the source and drain regions According to aspects of the present invention, the silicon layer 106 doped with an impurity having an opposite conductivity type to the source and drain regions 102s and 102d are formed to electrically connect a region adjacent to the channel region 102c in the edge region 102e, so that the current cannot flow to the edge region 102e and the edge region 102e cannot be used as the channel region. Moreover, according to aspects of the present invention, the portion of the edge region 102e is used as a body contact region 102b for contact with the gate electrode 108, so that a gate-body contact TFT may be formed without the extension of a separate body contact region and without increasing the size of the gate-body contact TFT with respect to the conventional gate-body contact TFT.

Figure 4A:
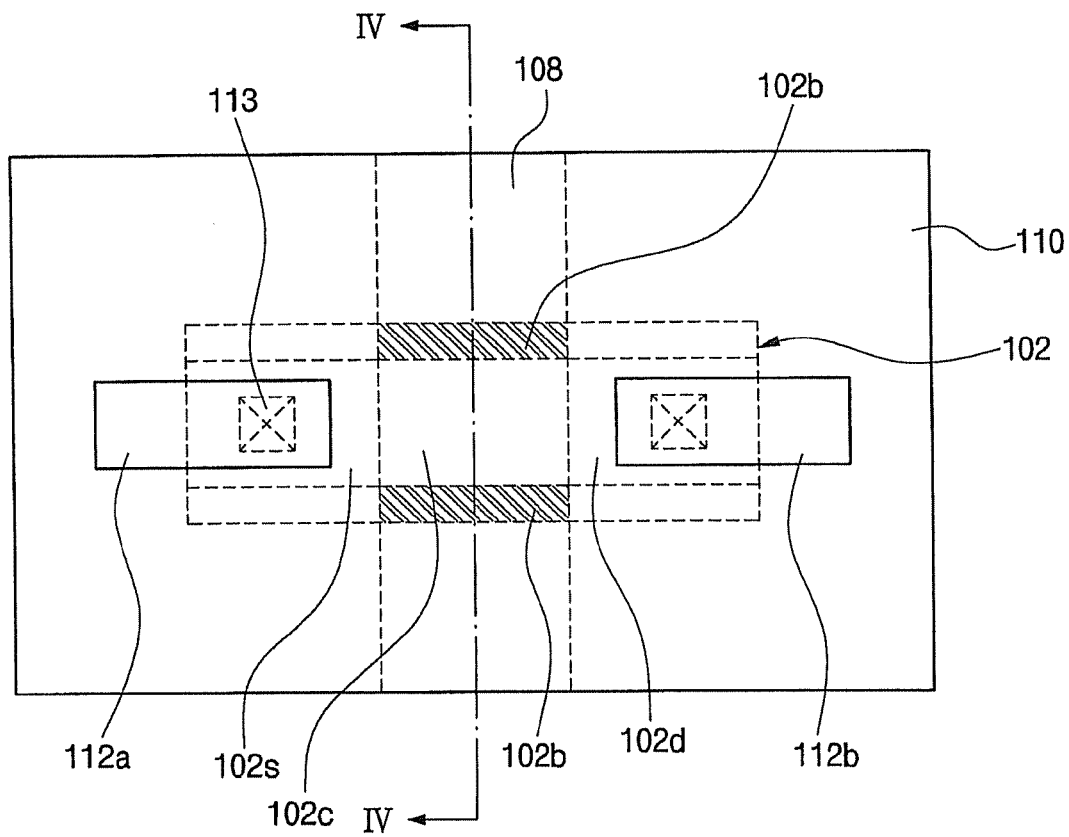
Figure 4B:
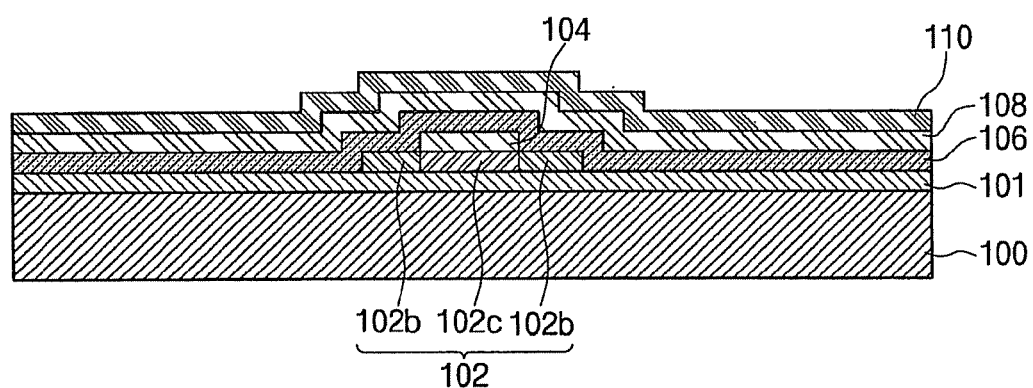

FIG. 4A is a plan view illustrating a method of fabricating a TFT according to an exemplary embodiment of the present invention, and FIG. 4B is a cross-sectional view taken along line IV-IV of FIG. 4A. Referring to FIGS. 4A and 4B, an interlayer insulating layer 110 is formed on the entire surface of the substrate 100. The interlayer insulating layer 110 may be formed of silicon nitride, silicon oxide, or combinations thereof.

Then, the interlayer insulating layer 110 and the gate insulating layer 104 are etched so as to form a contact hole 113 for each of the source and drain regions 102s and 102d. The contact holes 113 expose the source and drain regions 102s and 102d of the semiconductor layer 102. After that, source and drain electrodes 112a and 112b connected with the source and drain regions 102s and 102d through the contact holes 113 are formed. The source and drain electrodes 112a and 112b may be formed of one selected from the group consisting of molybdenum (Mo), chromium (Cr), tungsten (W), aluminum-neodymium (Al—Nd), titanium (Ti), molybdenum-tungsten (MoW), and aluminum (Al).

In another exemplary embodiment of the present invention, a process of gettering a crystallization-inducing metal in the semiconductor layer 102 using the silicon layer 106 doped with an impurity will be described. A polycrystalline silicon layer forming the semiconductor layer is crystallized by MIC, MILC, or SGS using a crystallization-inducing metal, and the crystallization-inducing metal remaining in the semiconductor layer 102 is gettered.

The gettering process is to getter the crystallization-inducing metal remaining in the semiconductor layer 102, particularly, the region to be a channel region 102e, to the edge region 102e by annealing the n-type or p-type impurity injected into the silicon layer 102 in the above exemplary embodiments.

Since, in the exemplary embodiments of the present invention, the silicon layer 106 is in contact with the body contact region 102b, which is an edge region 102e of the semiconductor layer 102, and the channel region 102c, the crystallization-inducing metal remaining in the channel region 102c moves a short distance to the edge region 102e in the gettering process using the doped silicon layer 106, so that gettering efficiency may be significantly increased.

The annealing process is performed for 30 seconds to 10 hours at a temperature ranging from 450 to 900° C. When the temperature is less than 450° C., the crystallization-inducing metal remaining in the semiconductor layer 102 is difficult to be sufficiently removed, and when the temperature is more than 900° C., the substrate 100 may be deformed due to the high temperature. Also, when the annealing time is less than 30 seconds, the crystallization-inducing metal remaining in the semiconductor layer 102 is difficult to be sufficiently removed, and when the annealing time is more than 10 hours, the substrate 100 may be deformed due to the long annealing time, production cost may be increased, and yield of the TFT may be decreased.

Figure 5:
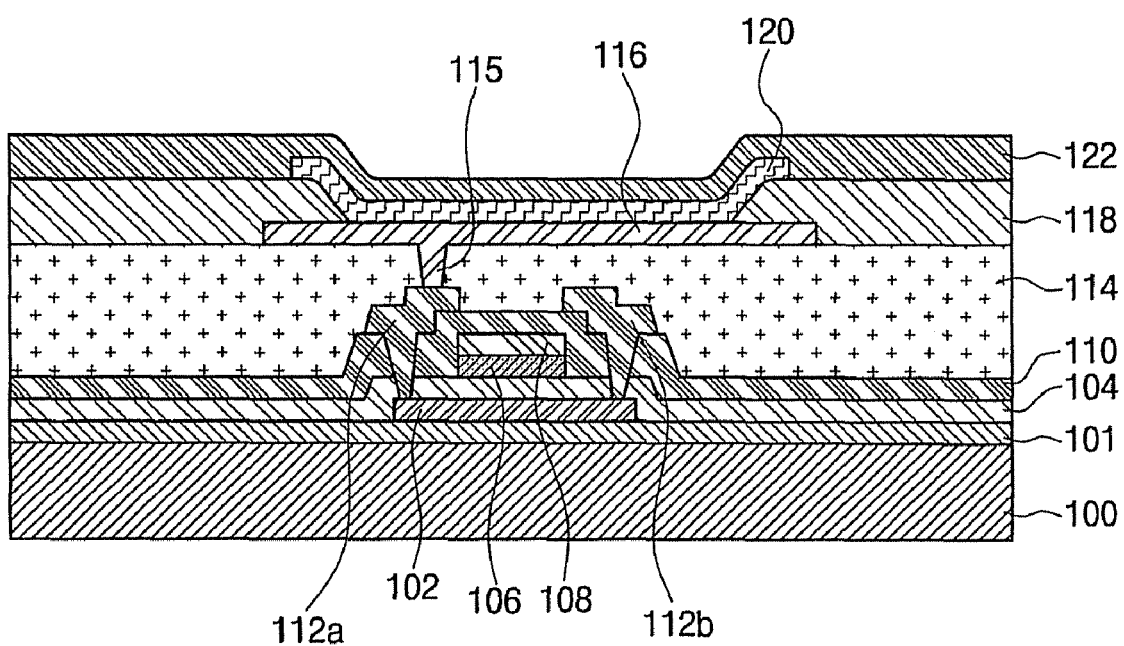
FIG. 5 is a cross-sectional view of an OLED display device having a TFT according to an exemplary embodiment of the present invention.

FIG. 5 is a cross-sectional view of an organic light emitting diode (OLED) display device having a TFT according to an exemplary embodiment of the present invention. Referring to FIG. 5, an insulating layer 114 is formed on the entire surface of the substrate 100 having the thin film transistor in FIG. 4 cut parallel to a source-drain direction, i.e., the length direction. The insulating layer 114 may be formed of an inorganic material selected from the group consisting of silicon oxide, silicon nitride, and silicate on glass, or an organic material selected from the group consisting of polyimide, benzocyclobutene series resin, and acrylate. Alternatively, the insulating layer 114 may be formed of a combination of the inorganic layer and the organic layer.

The insulating layer 114 is etched, and thus a via hole 115 is formed to expose one of the source or drain electrodes 112a or 112b. A first electrode 116 connected with one of the source and drain electrodes 112a and 112b through the via hole 115 is formed. The first electrode 116 may be an anode or a cathode. When the first electrode 116 is an anode, the first electrode 116 may be a transparent conductive layer formed of one of ITO, IZO and ITZO. When the first electrode 116 is a cathode, the first electrode 116 may be formed of Mg, Ca, Al, Ag, Ba, or alloys thereof.

Subsequently, a pixel defining layer 118, having an opening to expose a part of a surface of the first electrode 116, is formed on the first electrode 116. An organic layer 120 having a light emitting layer is formed on the exposed part of the first electrode 116. The organic layer 120 may further include a hole injection layer, a hole transport layer, a hole blocking layer, an electron blocking layer, an electron injection layer, and an electron transport layer, but is not limited thereto. Then, a second electrode 122 is formed on the organic layer 120. Thus, an OLED display device according to the exemplary embodiment of the present invention is completed.

According to aspects of the present invention, a thin film transistor, a method of fabricating the same, and an OLED display device having the same are provided. The gate-body contact TFT occupies a smaller area in a device than a conventional gate-body contact TFT structure by realizing a gate-body contact structure without a separately extended body contact region as in a conventional semiconductor layer region, which does not have a body contact region using an edge region of the semiconductor layer as a body contact region.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
    a substrate;
    a semiconductor layer disposed on the substrate, comprising a channel region, source and drain regions, and a first body contact region formed at a first edge of the semiconductor layer;
    a gate insulating layer disposed on the semiconductor layer and exposing the first body contact region;
    a silicon layer disposed such that the gate insulating layer is between the silicon layer and the channel region of the semiconductor layer, the silicon layer contacting the first body contact region;
    a gate electrode disposed on the silicon layer;
    an interlayer insulating layer disposed on the gate electrode; and
    source and drain electrodes disposed on the interlayer insulating layer and electrically connected with the source and drain regions, respectively,
    wherein the first body contact region is connected with the channel region, and
    wherein the silicon layer includes a first type of impurity, and the source and drain regions include a second type of impurity, the first and second types of impurities having opposite conductivities.

2. The thin film transistor according to claim 1, wherein a width of the gate insulating layer formed in the channel region of the semiconductor layer is less than the width of the channel region of the semiconductor layer.

3. The thin film transistor according to claim 1, wherein a width of the body contact region is more than 0 and not more than 0.1 μm.

4. The thin film transistor according to claim 1, wherein the first type of impurity is an n-type impurity, and the semiconductor layer is crystallized using a crystallization-inducing metal.

5. The thin film transistor according to claim 1, wherein the semiconductor layer further comprises a second body contact region formed in a second edge of the semiconductor layer, the second edge of the semiconductor layer being opposite the first edge of the semiconductor layer.

6. The thin film transistor according to claim 5, wherein the first and second body contact regions have a same length as the channel region of the semiconductor layer.

7. The thin film transistor according to claim 5, wherein the silicon layer covers the channel region and the first and second body contact regions.

8. A method of fabricating a thin film transistor, comprising:
    forming a semiconductor layer on a substrate;
    forming a gate insulating layer on the semiconductor layer to expose a part of an edge region of the semiconductor layer;
    forming a silicon layer on the gate insulating layer and the edge region of the semiconductor layer;
    injecting an impurity into the silicon layer;
    forming a gate electrode on the silicon layer in an area thereof corresponding to the semiconductor layer;
    forming an interlayer insulating layer on the gate electrode; and
    forming source and drain electrodes on the interlayer insulating layer electrically connected to source and drain regions of the semiconductor layer.

9. The method according to claim 8, wherein the edge region of the semiconductor layer exposed by the gate insulating layer includes an edge region connected with a channel region of the semiconductor layer.

10. The method according to claim 8, wherein the exposed edge region of the semiconductor layer is more than 0 and not more than 0.1 μm.

11. The method according to claim 8, wherein the injecting of the impurity into the silicon layer further comprises:
    injecting an impurity having a conductivity type opposite to a conductivity type of an impurity in source and drain regions of the semiconductor layer.

12. The method according to claim 8, wherein the injecting of the impurity into the silicon layer further comprises:
    injecting the impurity into the silicon layer using the gate electrode as a mask.

13. The method according to claim 8, further comprising:
    forming the semiconductor layer by crystallizing an amorphous silicon layer into a polycrystalline silicon layer using a crystallization-inducting metal;
    injecting an n-type impurity into the exposed edge region of the semiconductor layer using the gate insulating layer as a mask; and
    annealing the substrate and gettering the crystallization-inducing metal remaining in the semiconductor layer to the region into which the n-type impurity is injected.

14. The method according to claim 13, wherein the substrate is annealed for about 30 seconds to 10 hours at a temperature of about 450 to 900 ° C.

15. An organic light emitting diode (OLED) display device, comprising:
    a substrate;
    a semiconductor layer disposed on the substrate comprising: a channel region, source and drain regions, and a body contact region formed at a first edge of the semiconductor layer;

a gate insulating layer disposed on the semiconductor layer and exposing the body contact region;

a silicon layer disposed such that the gate insulating layer is between the silicon layer and the channel region of the semiconductor layer, the silicon layer contacting the first body contact region;

a gate electrode disposed on the silicon layer;

an interlayer insulating layer disposed on the gate electrode;

source and drain electrodes disposed on the interlayer insulating layer and electrically connected with the source and drain regions, respectively;

a first electrode electrically connected to one of the source and drain electrodes;

an organic layer disposed on the first electrode and comprising a light emitting layer; and a second electrode disposed on the organic layer, wherein the silicon layer includes an impurity having a first conductivity type, and the source and drain regions include an impurity having a second conductivity type, the first and second conductivity types being opposite.

16. The OLED display device according to claim 15, wherein the first body contact region is connected with the channel region.

17. The OLED display device according to claim 16, wherein a width of the gate insulating layer formed in the channel region is less than the width of the channel region.

18. The OLED display device according to claim 16, wherein a width of the body contact region is more than 0 and not more than 0.1 μm.

19. The OLED display device according to claim 15, wherein the silicon layer includes an n-type impurity, and the semiconductor layer is crystallized using a crystallization-inducing metal.

20. The OLED display device according to claim 15, further comprising:

a second body contact region formed in a second edge of the semiconductor layer, the second edge of the semiconductor layer being opposite the first edge of the semiconductor layer.

* * * * *